US005393562A

United States Patent [19]

Sebera

[11] Patent Number: 5,393,562

[45] Date of Patent: Feb. 28, 1995

[54] METHOD OF PRESERVING AND STORING BOOKS AND OTHER PAPERS

[75] Inventor: Donald K. Sebera, Bridgeton, N.J.

[73] Assignee: The United States of America as represented by the Librarian of Congress, Washington, D.C.

[21] Appl. No.: 80,612

[22] Filed: Mar. 2, 1993

[51] Int. Cl.[6] .............................................. C23C 16/00

[52] U.S. Cl. ................................. 427/248.1; 427/140; 427/254; 427/255.4

[58] Field of Search .................. 427/248.1, 254, 255.4, 427/140

[56] References Cited

U.S. PATENT DOCUMENTS

| | | | |
|---|---|---|---|
| 3,472,611 | 10/1969 | Langwell | 21/58 |
| 3,676,182 | 7/1972 | Smith . | |
| 3,703,353 | 11/1972 | Kusterer et al. | 427/395 |
| 3,969,549 | 7/1976 | Williams et al. | 427/248 |
| 4,051,276 | 9/1977 | Williams et al. | 162/160 |
| 4,863,566 | 9/1989 | Warren | 162/160 |
| 4,927,497 | 5/1990 | Sharpe | 162/160 |
| 5,094,888 | 3/1992 | Kamienski et al. | 427/296 |
| 5,104,997 | 4/1992 | Kamienski et al. | 556/130 |

FOREIGN PATENT DOCUMENTS 2208397 3/1989 United Kingdom .

OTHER PUBLICATIONS

Y. P. Kathpalia, Deterioration and Conservation of Paper, Part IV Neutralization, reprinted from Indian Pulp & Paper, vol. XVII, No. 4, Oct. 1962, pp. 226, 230–232.

G. M. Cunha, Mass Deacidification for Libraries, Library Technology Reports, May–Jun. '87, vol. 23 No. 3 two title pages, pp. 382–383.

U.S. Congress, Office of Technology, Book Preservation Technologies, 1988, pp. 96–97, Deacidification Processes no month.

*Primary Examiner*—Shrive Beck
*Assistant Examiner*—David M. Maiorana
*Attorney, Agent, or Firm*—Vito J. DiPietro; Thomas J. Byrnes; Herbert Berl

[57] ABSTRACT

Books and other documents that are produced wholly or partly on paper of wood pulp origin are preserved by storing in an enclosed space containing a controlled atmosphere including about 0.05 to 10 ppm ammonia gas. This invention and all United States patent rights thereunder are assigned to the Government of the United States as represented by the Librarian of Congress. The invention described herein may be manufactured and used by or for the Government of the United States of America for Governmental purposes without the payment of any royalties thereon.

20 Claims, No Drawings

METHOD OF PRESERVING AND STORING BOOKS AND OTHER PAPERS

BRIEF SUMMARY OF THE INVENTION

The invention concerns a method of preserving and storing books and other documents printed or otherwise produced on decidedly acidic paper or on paper of originally neutral pH but which became strongly acidified under the influence of acidic pollutants, and comprises their storage in a closed room having a controlled atmosphere which includes about 0.05 to 10 ppm of ammonia gas.

BACKGROUND OF THE INVENTION

Until the industrial revolution of the turn from the eighteenth century to the nineteenth century, books were almost universally printed on rag paper. Rag paper lasts for centuries, but was and still is expensive. The nineteenth century has provided mankind with inexpensive paper made of chemically treated wood chips ("wood pulp"), thereby placing books and newspapers within the economic reach of nearly everyone. Paper of wood origin cannot be printed or written upon, unless it is first treated with a sizing composition. A typical sizing composition is a mixture of rosin and alum (aluminum sulfate, $Al_2(SO_4)_3$). Alum readily reacts with moisture and generates sulfuric acid ($H_2SO_4$), a strong acid which contributes significantly to acid-catalyzed hydrolysis of the cellulose content of the paper and thereby embrittles and otherwise weakens and degrades it within about 5 to 75 years in the case of books, and in the case of newsprint even within a few weeks or months. Industrial pollution has aggravated the sulfuric acid problem for printed paper.

Other acids, such as the weak acid acetic acid ($CH_3.COOH$, sometimes written as HOAc) and its analogs are also found or formed in paper made from wood pulp and attack it.

The acidity of printing paper of wood origin is usually in the range of pH 4 to 5. A mildly acidic pH of about 6 is fairly harmless, the danger point for printing wood pulp paper being about 5.5. A neutral pH of 7 for such printing paper would be optimal but is not easy to maintain unless alkaline materials are added. Mild alkalinity in printing paper, such as a pH of about 7.5 to 8.5 from the additive, has the advantage of providing an "alkaline reserve" to furnish a margin of safety and protect the pH of the paper from going too far on the acid side and below the pH 5.5 danger point. However, excessive alkalinity in printing paper, i.e. above pH 11, should also be avoided.

Numerous chemical treatments to reduce the acidity of commercial printing paper are known. The Preservation Office of the Library of Congress, Washington, D.C. has published in 1991 a "Bibliography on Mass Deacidification," listing over 250 texts (books, articles, representative patents, etc.) up to 1990. An ideal paper deacidification treatment, combining permanence, cost effectiveness and safety has not yet been found.

The Library of Congress, as the world's greatest repository of books and manuscripts, is currently developing a mass paper deacidification treatment with the vapor of diethyl zinc (DEZ), which has the advantage of effectiveness and permanence. This treatment is covered by U.S. Pat. Nos. 3,969,549 (1976) and 4,051,276 (1977), Williams and Kelly, both assigned to the Government of the United States as represented by the Librarian of Congress.

Diethyl zinc in vapor form is a safe chemical when handled properly. However, this process requires skillful handling because diethyl zinc is usually shipped in the liquid state and in that state tends to react violently with water and has pyrophoric properties. Also diethyl zinc is presently somewhat costly. A 1988 publication by the Office of Technology Assessment (OTA) of the Congress of the United States entitled "Book Preservation Technologies" contains (pp. 54/55 and 111) an estimate by the Library of Congress of operating costs of a DEZ deacidification facility for a throughput of one million books per year, at about $1.82 per book (not including plant capital recovery and the handling and transportation of books outside the deacidification facility).

OBJECTS AND BRIEF DESCRIPTION OF THE INVENTION

The present invention concerns an alternative solution of the problem of paper deacidification, namely, a method of preserving and storing cellulosic paper initially of a pH below 5.5 such as books, newspapers and other printed papers, as well as maps, manuscripts and similar documents, by placing them in a closed storage room having a controlled atmosphere which contains ammonia gas in a range from about 0.05 to about 10 volume parts per million (ppm). Within this range, a range of about 0.1 to about 5 ppm is preferred for most grades of printing paper. This method raises the pH of the stored paper safely above the danger point of 5.5, and after a period of storage in this controlled atmosphere substantially converts the acidity of the paper to neutral or near neutral or mildly alkaline, without incurring the danger of damage to the paper from excessive alkalinity. The pH adjustment is not permanent; i.e., when the paper is removed from storage, its pH will ultimately revert to near its original acidity below 5.5. The damaging effects of this reversion are easily avoided, however, by returning the paper to the ammonia-containing controlled atmosphere within a reasonable time and thereby returning the pH of the paper to a value safely above the 5.5 pH danger point.

A principal advantage of this method is its safety and economy. Inasmuch as ammonia gas is very inexpensive, the materials cost at the low concentrations required for the practice of the invention is quite nominal. The economical factor thus counterbalances the non-permanent nature of the treatment.

Other advantages of the inventive method are its complete safety and ease of practice. Still another object and advantage of the invention is the flexibility of the herein disclosed treatment. For instance in the case of newly printed inexpensive books on paper of pH 5, a very low concentration of ammonia will suffice to afford inexpensive protection at a mildly acidic pH of about 6 as the result of controlled storage, while in the case of valuable manuscripts written on paper having a pH of or below 4, storage at a higher concentration of ammonia, e.g., of the order of 1 ppm would be required to raise the pH of the paper to a neutral or mildly alkaline pH and thereby bring incipient paper damage nearly to a halt.

Even books printed on cellulosic paper of a neutral or nearly neutral pH of about 7, due to the use of alum-free paper by the printer manufacturer, may nevertheless be subject to acid damage by chemical interaction with the sulfuric acid component of polluted air, especially in urban areas. Protection of such books can be achieved by raising their pH with a low concentration of ammonia gas to near neutral values in closed environment storage.

It has been heretofore proposed to permanently deacidify books with ammonia gas in a sealed chamber. This was attempted in India by Yashpal Kathpalia in 1955, reported in the abovecited 1988 Congressional Office of Technology publication "Book Preservation Technologies" at pp. 96/97. This process has not been accepted elsewhere because it imparted a strong odor of ammonia to the treated books and the upward adjustment of the pH of the treated paper was only temporary. After removal of the books from the treating chamber to the open shelves of the library, ammonia was lost, and the books returned to an acidic condition. Periodically re-treating the re-acidified books would necessitate repeated removal of the books from their shelves and reshelving them and thus would not be an economically acceptable library practice. The high levels of ammonia released into the library would also be unacceptable because of ammonia's pungent odor at those concentrations.

FURTHER DESCRIPTION OF THE INVENTION

The method of the present invention avoids the drawback of the Kathpalia method, by not aiming for permanent deacidification, but rather by providing a long-term book storage system at controlled low concentrations of ammonia gas in a closed room, thereby taking advantage of the very low cost of ammonia gas without expecting of it what it cannot do, namely, effecting a permanent rise in the pH of the stored paper. The effective concentration of ammonia gas may be as low as 0.05 ppm, but preferably should be between 0.5 and 5 ppm, and may go up to about 10 ppm by volume.

In a concentration higher than about 1 ppm by volume, ammonia gas imparts a noticeable ammonia smell to the atmosphere of a closed system. While not injurious to humans except at much higher concentrations of ammonia gas well above 10 ppm, the ammonia smell of the storage room would nevertheless tend to annoy library personnel who take the books out of storage and replace them in the controlled atmosphere. An ammonia gas concentration of about 1 ppm is quite sufficient for the in-storage preservation of books, newspapers and other paper documents. When higher concentrations of ammonia gas up to about 5 or even 10 ppm by volume are needed in order to preserve highly acidic book pages, robotic devices can be used to take the books out of and into storage.

An optional pretreatment of the acidic pH books or other papers with ammonia gas of a higher concentration than of 1 ppm carried out in a separate treating chamber, shortly before the paper is placed in the closed storage room containing the controlled atmosphere characterized by a low concentration of ammonia gas, will accelerate the onset of the beneficial effect of the latter. This pretreatment should be carried out at a concentration of ammonia gas from about 2.5 ppm to about 10 ppm and should be discontinued before the paper has acquired a significant ammonia smell. The foregoing optional pretreatment will initially raise the pH of the paper to 7 or higher, but will not by itself permanently deacidify the paper, inasmuch as the reaction between the ammonia gas and the acidic components of the paper is reversible. The above-described paper pretreatment with ammonia gas may be further accelerated, if desired, by reducing the air pressure in the treating chamber to below atmospheric when admitting the ammonia gas to the books in the treating chamber. Upon termination of the pretreatment, the paper is removed to a closed storage room having the desired controlled atmosphere, containing gaseous ammonia in a range from about 0.05 to about 10 ppm, preferably from about 0.1 to about 5 ppm.

The chemical reactions involved in the protective storage system of the present invention are quite straightforward:

$$\underset{\text{(ammonia gas)}}{2NH_3} + \underset{\text{(strong sulfuric acid in paper)}}{H_2SO_4} \longrightarrow \underset{\text{(solid salt of ammonium sulfate in paper)}}{(NH_4)_2SO_4}$$

and $$\underset{\text{(gas) ammonia gas}}{NH_3} + \underset{\text{(aqueous) acetic analogous acid in paper}}{CH.COOH} \longrightarrow \underset{\text{(solid) solid salt of ammonium acetate in paper}}{NH_4.\ COO.\ CH_3}$$

Both reactions are to a minor extent reversible; e.g.:

$$(NH_4)_2SO_4 \rightleftharpoons H_2SO_4 + 2NH_3$$

$$NH_4.O_2CCH_3 \rightleftharpoons CH_3CO_2H + NH_3$$

Inasmuch as ammonium sulfate $(NH_4)_2SO_4$ is a very stable compound, the ammonia gas pressure above ammonium sulfate (a crystalline solid) to maintain a given pH is very low. At a pH value of 5 for sulfated wood pulp paper, the ammonia gas concentration pressure in air above the solid ammonium salt of sulfuric acid is about 0.005 ppm by volume in a closed system. However, at pH 5, the acid-catalyzed hydrolysis of cellulose and its destructive effect on the acidic paper are at a dangerously high level. In order to maintain a pH value of 7 for sulfated paper, the required ammonia gas concentration is estimated to be about 0.05 ppm.

In the case of an ammonium salt of a weak acid, such as the ammonium salt of acetic acid, the ammonia gas pressure above the solid ammonium acetate is somewhat lower than in the case of ammonium sulfate. Accordingly, in the case of paper that has been acidified by both strong (e.g. sulfuric) and weak (e.g. acetic) acids, the equilibrium back acids can be neutralized by the same low concentrations of ammonia.

A preferred temperature range for paper storage in accordance with the present invention is about 35° to 75° F.; e.g., a room temperature of about 70° F. Inasmuch as ammonia gas is lighter than air, it is desirable to provide a fan inside the storage room, to avoid an accumulation of ammonia gas at the top of the storage room.

Periodic checks of the pH of the stored paper may be accomplished by the use of standard methods published by TAPPI (Technical Association of the Pulp and Paper Institute).

It is advantageous to maintain the air and ammonia at a pressure slightly above ambient atmospheric pressure.

The ammonia gas may be admitted to the storage room through a pipe from the outside or from a pressurized flask located inside the storage room through a control valve.

In accordance with accepted practice, it is recommended to exchange the ammonia-enriched air inside the room every few days for a new supply of fresh air and to add enough ammonia gas to bring its concentration back to the selected low but effective value. If robotic or other non-human access to book storage areas is utilized, a reduced rate of fresh air will be required. The selected low concentration of ammonia gas is easily maintained by the use of conventional monitoring equipment.

Hermetic sealing of the storage room is not necessary, but reasonably airtight walls and a well-fitted double door are recommended.

The following examples illustrate the invention but are not intended to limit its scope to the specific conditions set forth.

EXAMPLE 1

Books composed of pages of paper of about pH 4, whose acidity is caused by sulfuric acid introduced during paper manufacture and by subsequent exposure of the paper to polluted air containing $SO_2$ and SO3, will be placed in a storage chamber in which ammonia gas is maintained at a concentration of 1 ppm (by volume).

After a period of time, typically 3–4 months under library storage conditions, all of the $H_2SO_4$ will react with ammonia, forming ammonium sulfate.

The pH of the paper immediately after removal from storage will be neutral or near neutral. If the paper thereafter is maintained in an ammonia-free atmosphere, the pH of the paper will gradually decrease through the loss of ammonia and regeneration of $H_2SO_4$, until the pH returns to about 4. However, if the book is returned to a 1 ppm $NH_3$ atmosphere either immediately or after an extended unprotected period, the regenerated acids will again be neutralized and the book will be restored to a non-damaging pH value.

EXAMPLE 2

Example 1 will be repeated with a book whose paper is at a pH of 5.5. This book will also increase in pH to a moderate alkaline value, but less time will be required since less strong acid is initially present which must be neutralized by inward diffusion of ammonia.

In an ammonia-free atmosphere the book paper will gradually revert to pH 5.5, and will reach this value in a time shorter than that for the pH 4 book pages of the preceding Example. The pH will not drop below the initial 5.5 value.

I claim:

1. Method of operating a long-term book storage and preservation system for books having pages of acidic paper in a room having no noticeable ammonia smell and an environment which is non-toxic to humans comprising placing said books for long-term storage in a closed storage room having a controlled continuously maintained mildly alkaline atmosphere which includes gaseous ammonia in a range from about 0.05 to about 1 volume parts per million, whereby the acidity of said book pages is gradually neutralized or an already neutralized book is maintained in a neutralized condition by storage in said long-term storage room.

2. Method according to claim 1, wherein said range of gaseous ammonia is from about 0.1 to about 1 volume part per million.

3. Method according to claim 1, wherein said ammonia gas is agitated within the interior of said storage room.

4. Method according to claim 1, wherein a stored book is temporarily removed from said storage room and is returned to said storage room before the pages of said book sustain substantial damage from prolonged exposure to the uncontrolled atmosphere outside said storage room.

5. Method according to claim 1 wherein said books are pretreated in a separate treating chamber with ammonia gas in a ratio not exceeding 10 volume parts per million to raise the pH of the book pages to neutral before said books are placed in said closed storage room.

6. Method according to claim 1, wherein the temperature of said storage room is maintained between about 35° F. and about 75° F.

7. Method according to claim 1, wherein the pages of said books are printed on paper of wood pulp origin.

8. Method according to claim 1, wherein said atmospheric air and said gaseous ammonia in said storage room are periodically exchanged for a fresh supply of atmospheric air and gaseous ammonia within said range.

9. Method according to claim 1, wherein said mildly alkaline atmosphere in said long-term storage room is maintained at a slightly positive pressure above ambient pressure.

10. Method according to claim 1, wherein said mildly alkaline atmosphere in said long-term storage room is maintained at a temperature between about 35° F. and about 75° F.

11. Method of operating a long-term storage and preservation system for acidic paper of cellulosic material in a room having no noticeable ammonia smell and an environment which is non-toxic to humans, comprising placing said paper for long-term storage in a closed storage room having a controlled continuously maintained mildly alkaline atmosphere which includes gaseous ammonia in a range from about 0.05 to about 1 volume part per million, whereby the acidity of said paper is gradually neutralized or an already neutralized paper is maintained in a neutralized condition by storage in said long-term storage room.

12. Method according to claim 11, wherein said range of gaseous ammonia is from about 0.1 to about 1 volume parts per million.

13. Method according to claim 11 wherein said paper is printed paper.

14. Method according to claim 11, wherein said printed paper is in book form.

15. Method according to claim 11, wherein said printed paper is in the format of a newspaper.

16. Method according to claim 11, wherein said controlled atmosphere is maintained at a positive pressure slightly above ambient atmospheric pressure.

17. Method according to claim 11, wherein said atmospheric air and said gaseous ammonia in said storage room are periodically exchanged for a fresh supply of atmospheric air and gaseous ammonia within said range.

18. Method according to claim 11, wherein said mildly alkaline atmosphere in said long-term storage room is maintained at a slightly positive pressure above ambient pressure.

19. Method according to claim 11 wherein said controlled mildly alkaline atmosphere in said long-term storage room is maintained at a temperature between about 35° F. and 75° F.

20. Method of operating a long-term book storage and preservation system for books having pages of acidic paper in a room having no noticeable ammonia smell and an environment which is non-toxic to humans, comprising placing said books for long-term storage in a closed storage room having a controlled continuously maintained mildly alkaline atmosphere which includes gaseous ammonia in a range from about 0.05 to about 1 volume parts per million, whereby the acidity of said book pages is gradually neutralized by storage in said long-term storage room.

* * * * *